United States Patent [19]

Tanaka et al.

[11] Patent Number: 6,120,945
[45] Date of Patent: Sep. 19, 2000

[54] METHOD OF DEVELOPING A PHOTORESIST PATTERN AND A DEVELOPING APPARATUS

[75] Inventors: Yasuharu Tanaka; Teruyuki Midorikawa, both of Saitama-ken, Japan

[73] Assignee: Kabushiki Kaisha Toshiba, Kawasaki, Japan

[21] Appl. No.: 09/062,832

[22] Filed: Apr. 20, 1998

[30] Foreign Application Priority Data

May 15, 1997 [JP] Japan ................................. 9-125826

[51] Int. Cl.⁷ ........................... G02B 5/20; G02F 1/1335; G03E 7/30
[52] U.S. Cl. ................. 430/7; 430/30; 430/325; 396/570
[58] Field of Search ................. 430/7, 30, 325; 396/570, 604, 611, 626, 627; 349/106

[56] References Cited

U.S. PATENT DOCUMENTS 5,223,881  6/1993  Nakagawa et al. ..................... 396/570

FOREIGN PATENT DOCUMENTS 7-110580  4/1995  Japan .
7-140671  6/1995  Japan .

*Primary Examiner*—John A. McPherson
*Attorney, Agent, or Firm*—Oblon, Spivak, McClelland, Maier & Neustadt, P.C.

[57] ABSTRACT

A method of developing photoresist films formed on a plurality of substrates utilizes a circulated developing fluid to sequentially develop the photoresist films with developing accuracy and controllability secured. It includes the steps of measuring the conductivity and the absorbance of the developing fluid, calculating the pH value or its equivalence thereof in accordance with the conductivity and absorbance measured in the measuring step; and maintaining the pH value or its equivalence to be in a predetermined range. There are also disclosures as to an apparatus for developing photoresist films, and a color filter and a liquid crystal display device manufactured by the method of developing photoresist films.

27 Claims, 6 Drawing Sheets

METHOD OF DEVELOPING A PHOTORESIST PATTERN AND A DEVELOPING APPARATUS

BACKGROUND OF THE INVENTION

Field of the Invention

This invention relates to a method of developing a photoresist pattern and a developing apparatus. More particularly, the present invention is directed to a control method of the density of a developing fluid and a developing apparatus with such developing fluid density control.

Figure 1:
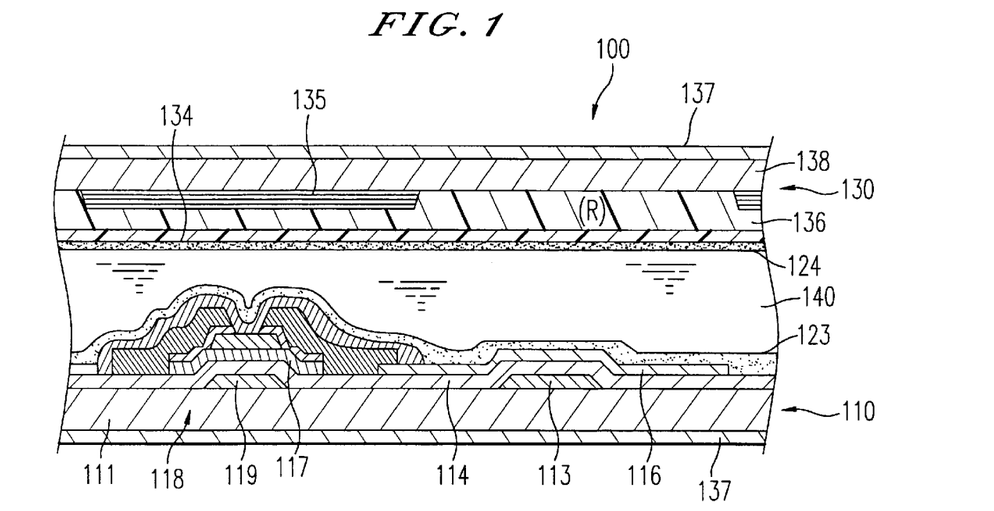
FIG. 1 is a sectional view of a liquid crystal display device.

As shown in FIG. 1, a color active matrix-type liquid crystal display device 100, for instance, has a structure are that array and counter substrates 110 and 130 are provided opposite to each other and a liquid crystal composition 140 is held between the substrates 110 and 130 through alignment layers 123 and 124, respectively. The substrates 110 and 130 consist of glass plates 111 and 138 on the outer surface of which polarizers 137 are attached, respectively. The array substrate 110 is provided with thin film transistors (TFTs) 118 including amorphous silicon (a-Si) semiconductor layers 117, and display electrodes 116, signal lines, storage capacitor lines 113, scanning lines and gate electrodes 119 connected to the transistors 118. The storage capacitor lines 113 and the gate electrodes 119 are covered with an insulation layer 114. The counter substrate 130 is further provided with light blocking layers 135, color filters 136 and counter electrodes 134.

The most practical color filter used for such a liquid crystal display device is produced in the steps in which a pigment dispersion color photoresist film is coated on a surface of a substrate and exposure with masks of the photoresist film and development thereof are repeated to perform patterning.

The most widely used color photoresist film is made of an acrylic system radical polymerization material. Alkaline developing fluids are used for developing the photoresist film. The fluids may be inorganic alkaline solutions in water such as those of calcium hydroxide, sodium hydroxide and the like. Since the TFTs of the liquid crystal display device, however, are adversely affected by alkaline ion impurities, organic alkaline solutions, e.g., tetramethylammonium hydride (TMAH) and the like are substituted therefor.

The acrylic system radical polymerization photoresist material has a chemical structure in which no light irradiated portions of the photoresist material become soluble due to a chemical reaction to alkaline components but light irradiated ones thereof becomes insoluble because of polymerization reaction. Thus, development with good reproducibility necessitates maintaining a fixed developing fluid temperature and a constant alkaline component density in the fluid. In short, it is necessary to keep pH (hydrogen power) of the fluid constant.

An improvement in the aperture ratio of a liquid crystal display device has been recently desirable for further higher brightness and lower power consumption. It also means demanding color filters to have higher patterning accuracy. It is highly expected to control the density of a developing fluid much better.

A solution pH value in water is generally measured by a pH meter with glass electrodes but its measurement accuracy is, in principle, low with an alkaline solution. Since the measurement error increases as the glass electrodes are soaked in the alkaline solution for longer time, the calibration of the pH meter must be carried out once in a couple of hours. Because of the reasons set forth above, it is difficult to control the density of alkaline components in a developing fluid in accordance with pH measurement. It is, therefore, a common practice to measure electric conductivity thereof instead of pH measurement and keep the conductivity constant.

The method of controlling the density of developing fluid to keep the conductivity constant still has a problem in which pH values vary in accordance with continuous developing even though such constant conductivity is held. In other words, even if the pH value is constant, the conductivity changes as the photoresist material is dissolved in the developing fluid.

This problem can be overcome if the developing fluid is disposable and kept always fresh but processing cost thereby becomes more expensive and disadvantageous. Practically, therefore, absorbance of the developing fluid is measured to monitor the density of the photoresist material dissolved therein and keep it constant. Developing accuracy is experimentally derived out for certain density values of the photoresist material in the developing fluid to keep the conductivity thereof constant.

According to this practical method, however, the development is not carried out with good controllability unless the absorbance, i.e., the photoresist density in the developing fluid, reaches a predetermined value. In addition, the fluid is not utilized efficiently.

SUMMARY OF THE INVENTION

A first object of the present invention is to provide a method of developing a photoresist pattern in which density of a developing fluid is kept optimum by controlling the conductivity thereof. A second object of the invention is to provide a method of developing a photoresist pattern which is capable of improving utilization efficiency of a developing fluid without deterioration of developing accuracy and controllability. A third object of this invention is to provide a developing apparatus to carry out such a method.

A method of developing photoresist films of the present invention is characterized with the following features. The developing is carried out by means of a recirculated developing fluid. The photoresist films are formed on a plurality of substrates and are exposed to make predetermined patterns. The conductivity and absorbance thereof are measured and monitored. Those measured data are used to calculate pH values of the developing fluid or data corresponding thereto. In accordance with the calculated data, the developing fluid is controlled to keep the pH values or the data corresponding thereto in a predetermined range.

According to the present invention a method of developing photoresist films is carried out by means of a recirculated developing fluid. The photoresist films are formed on a plurality of substrates and are exposed to make predetermined patterns. The conductivity and absorbance thereof are measured and monitored. Those measured data are applied to the following equation (1) to calculate pH values of the developing fluid or data corresponding thereto.

$$A \cdot \log(\rho) + B \cdot A_b \tag{1}$$

where $\rho$ and $A_b$ denote the conductivity and absorbance of the developing fluid, respectively, and A and B are constants. In accordance with the calculated data, the developing fluid is controlled to keep the pH values or the data corresponding thereto in a predetermined range.

According to the present invention, a method of developing photoresist films is carried out by means of a recirculated developing fluid. The photoresist films are a plurality of kinds, formed on substrates and exposed to make predetermined patterns, respectively. The conductivity and absorbance thereof are measured and monitored. Those measured data are applied to the following equation (2) to calculate pH values of the developing fluid or data corresponding thereto.

$$A \cdot \log(\rho) + \sum_{i=1}^{n}(B_i \cdot A_{bi} + C_i) \quad (2)$$

where $\rho$; the conductivity of the developing fluid;

$A_{bi}$; the absorbance thereof at a predetermined wavelength for each photoresist film $B_i$; constant corresponding to $A_{bi}$;

$A$; constant;

$C_i$; constant corresponding to kinds used for the photoresist films; and $n$; integers which are smaller than the number of kinds used for the photoresist films.

In accordance with the calculated data, the developing fluid is controlled to keep the pH values or the data corresponding thereto in a predetermined range.

Further, according to the present invention, a method of developing photoresist films is carried out by means of a recirculated developing fluid. The photoresist films are formed on a plurality of substrates and are exposed to make predetermined patterns. The conductivity and absorbance thereof are measured and monitored. Those measured data are applied to the following equation (3) to calculate pH values of the developing fluid or data corresponding thereto.

$$A \cdot \log(\rho) + B \cdot A_b \quad (3)$$

where $\rho$; the conductivity of the developing fluid, $A_b$; the absorbance of the fluid at a wavelength with which each photoresist material dissolved in the fluid has substantially the same change with respect to the absorbance, $A$ and $B$; constants. In accordance with the calculated data, the developing fluid is controlled to keep the pH values or the data corresponding thereto in a predetermined range.

In measuring the absorbance, it is desirable to use light which wavelength is in the range of infrared or ultraviolet rays, or in the range of visible light close to infrared or ultraviolet rays. When, in particular, light with a wavelength in the range of visible light is used for measurement of the absorbance of a plurality of different color photoresist films applied, there is no distinction among measured values of the absorbance thereof. Thus, it is desirable to use light with the specific wavelength set forth above for measurement of the absorbance.

According to the present invention, the control of pH values is achieved by supply of a fresh developing fluid or a thick developing fluid. In the case that a developing fluid is a water solution, its solvent is water. It is desirable, in this case, to control pH values or data derived from the equation (1), (2) or (3) in such a manner that they should be within the range of ±10% from the initial value of the developing fluid. Any developing fluid can be unlimitedly used to carry out this invention whichever it may develop photoresist films. The equations set forth above are especially suitable for alkaline developing fluids, such as tetramethylammonium hydride, methylpiperidine and trimethylamine.

According to the present invention, pH values of a developing fluid or data corresponding thereto can be derived out from measurement data of conductivity and absorbance of the developing fluid. Thus, pH values of the developing fluid or data corresponding thereto are properly controllable by monitoring the conductivity and the absorbance. PH values of the developing fluid can be adjusted in accordance with the conductivity even for the case of the density change of photoresist material dissolved in the developing fluid. Thus, the utilization efficiency of the developing fluid is significantly improved without the decline of development controllability.

The above-stated and other objects and technical features of the present invention will become apparent from the following description when taken with the accompanying drawings. It will be understood, however, that the drawings are for purposes of illustration and are not to be construed as defining the scope of the invention, reference being had for the latter purpose to the claims appended hereto.

DETAILED EXPLANATION OF THE PREFERRED EMBODIMENT

Various embodiments of the present invention will be explained in detail hereinafter.

Embodiment 1

The inventors have conducted the following experiment to examine the relationship between the conductivity, absorbance or pH of a developing fluid and the number of photoresist films to be processed in the case that development has been performed for a photoresist film with a predetermined pattern formed on a substrate.

Figure 2:
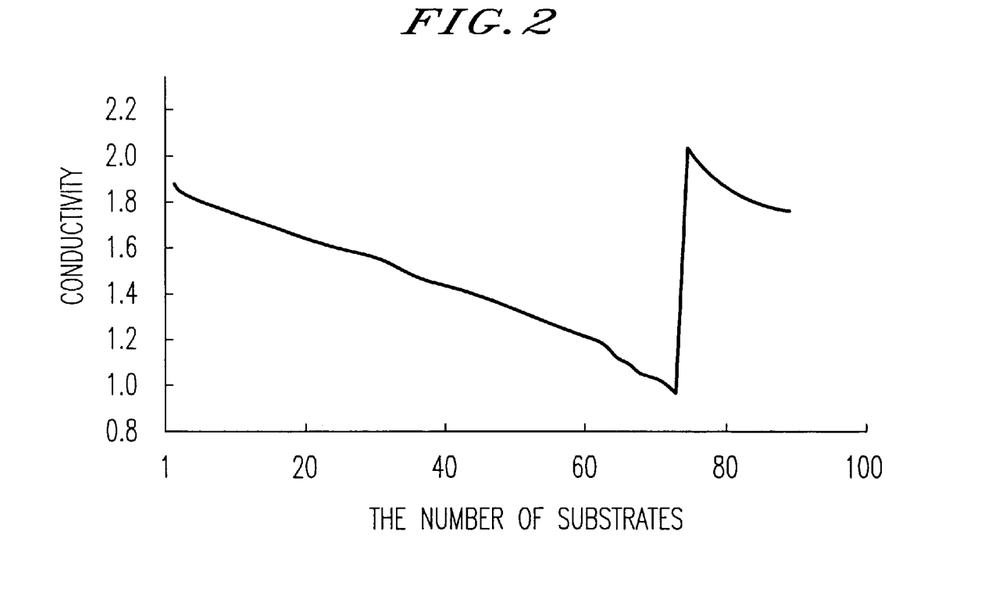
FIG. 2 is a characteristic diagram with respect to the number of color filter sheets to be processed and the conductivity of a developing fluid.

Prepared have been sample glass substrates on which the photoresist film of an acrylic system negative material (Product No. CB-2000 manufactured by Fuji Hunt Electronics Technology, Inc.) has been coated in a thickness of 2 $\mu$m. The photoresist film has been then exposed to form its predetermined pattern. Further, the exposed photoresist film has been developed in a circulated developing fluid consisting of a water solution of tetramethylammonium hydride (TMAH). The conductivity of the fluid has been measured in every development process. FIG. 2 shows the relationship between the conductivity of the fluid and the number of processed glass substrates.

Figure 3:
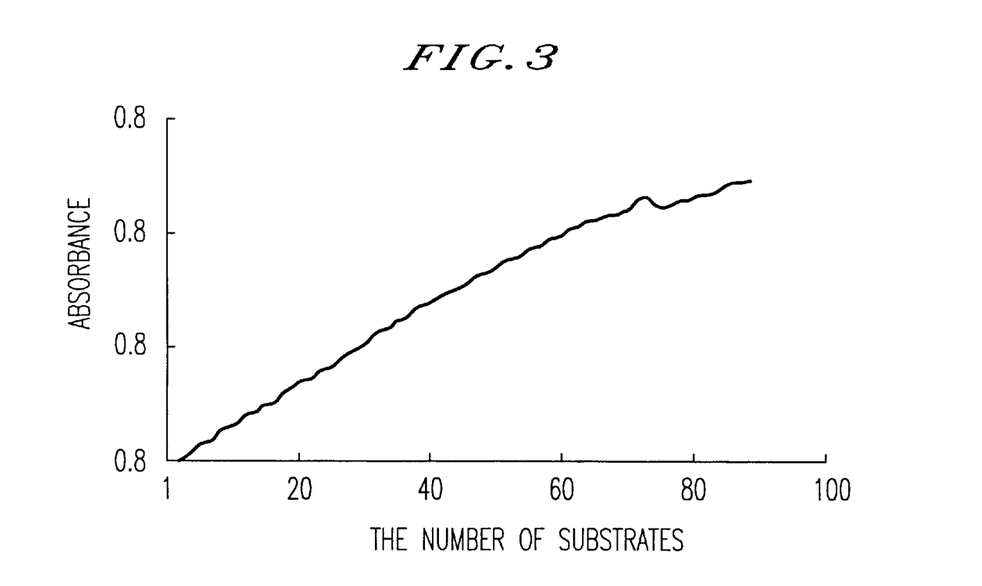
FIG. 3 is a characteristic diagram with respect to the number of color filter sheets to be processed and the absorbance of a developing fluid.
Figure 4:
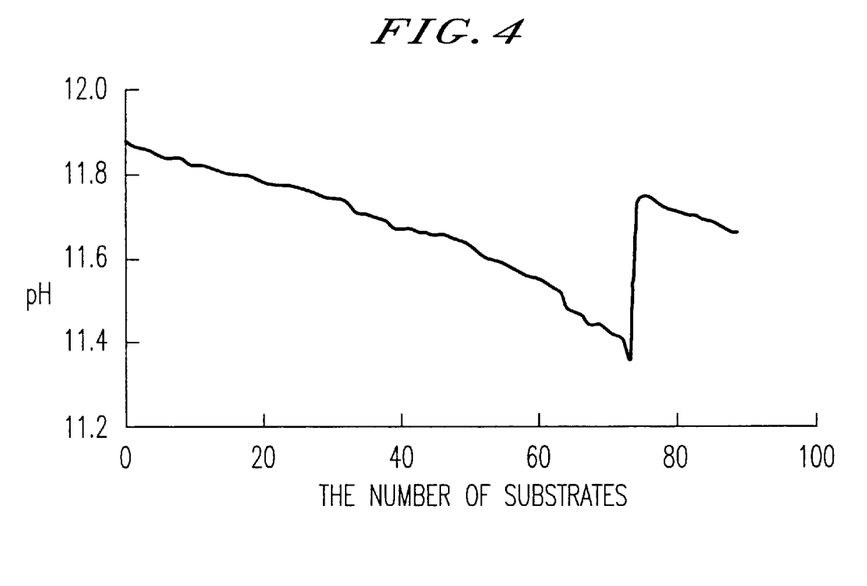
FIG. 4 is a characteristic diagram with respect to the number of color filter sheets to be processed and pH values of a developing fluid.

Similarly, the absorbance and pH of the fluid have been measured in every developing process. FIGS. 3 and 4 indicate the relationship between the absorbance and pH and the number of the processed substrates, respectively.

The developing fluid has been initially adjusted to be 0.06 wt % in density. 74 sheets of the substrates have been developed in the fluid. After that but before 75th sheet of the substrate is developed, the TMAH has been added to make the fluid approximately initial in conductivity and the next developing process has commenced. The fluid has been initially 11.9 in pH but the TMHA has been replenished when it has become 11.35 in pH.

From the results shown in FIGS. 2 through 4, it is apparent that the conductivity and pH decrease as the number of the processed substrates increases but they abruptly rise when a fresh developing fluid is replenished. Nevertheless, the absorbance increases as the number of the substrates increases but it does not fall greatly even in the event that a fresh developing fluid is added.

Figure 5:
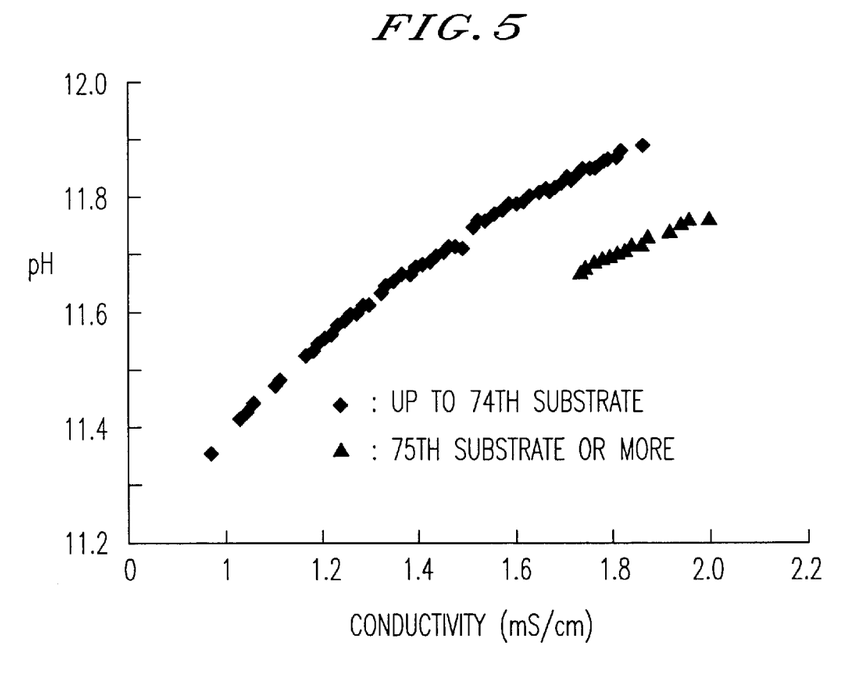
FIG. 5 is a characteristic diagram with respect to the conductivity of a developing fluid and pH values.

FIG. 5 indicates the conductivity and the pH values plotted in accordance with the results shown in FIGS. 2 through 4. It is noted that, once the fresh developing fluid has been replenished, the pH values do not return to the initial one while the conductivity becomes slightly higher than the initial one. That is affected by the photoresist material dissolved in the developing fluid. In the event that a developing fluid is different in density of photoresist material, the pH value thereof is different even though the conductivity is the same.

Figure 6:
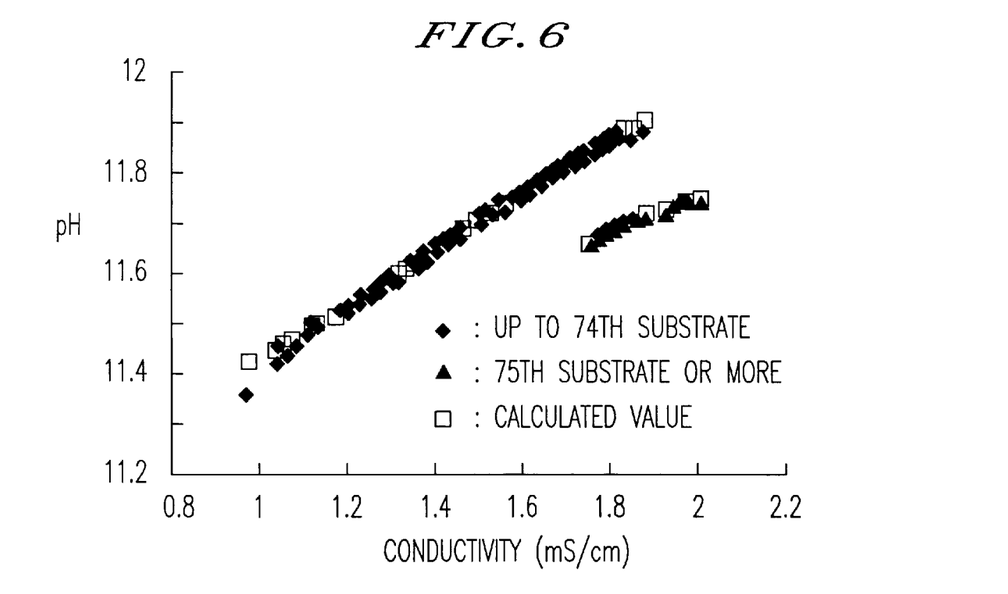
FIGS. 6 through 8 are characteristic diagrams with respect to the conductivity of a developing fluid and pH values calculated in accordance with actually measured conductivity and absorbance data.

The following equation (4) is assumed and the constants A, B and C thereof are sought by applying the least-squares method to the experimental data. FIG. 6 indicates calculated pH result values plotted and overlapped with the graphs of FIG. 5. It is clear from FIG. 6 that the experimental data are well consistent with the calculated ones.

$$\text{pH value} \approx A \cdot \log(\rho) + B \cdot Ab + C \qquad (4)$$

The density of the developing fluid is controlled to maintain a pH value to be constant. That is to say, it is adjusted so that the pH value derived from applying the above-identified equation to the measured conductivity and absorbance may be kept constant. As a result, a photoresist pattern with a stabilized size can be obtained. Further, the photoresist film can be provided with a good developing quality even though the developing fluid varies in density of the photoresist material.

Embodiment 2

This embodiment is directed to a plurality of kinds of photoresist films patterned on substrates. Prepared have been sample glass substrates on which red, green and blue photoresist films of acrylic system negative materials (Product Nos. CR-2000, CG-2000 and CB-2000 manufactured by Fuji Hunt Electronics Technology, Inc.) have been coated in thickness of 2 μm, respectively. The photoresist films each have been subject to exposure and, then, development in a circulated developing fluid consisting of a water solution of TMAH.

The developing fluid has been initially adjusted to be 0.06 wt % in density. 74 sheets of the substrates have been developed in the fluid. After that but before 75th sheet of the substrate is developed, the TMAH has been added to return the conductivity of the fluid approximately to the initial one and the next developing process has commenced.

Figure 7:
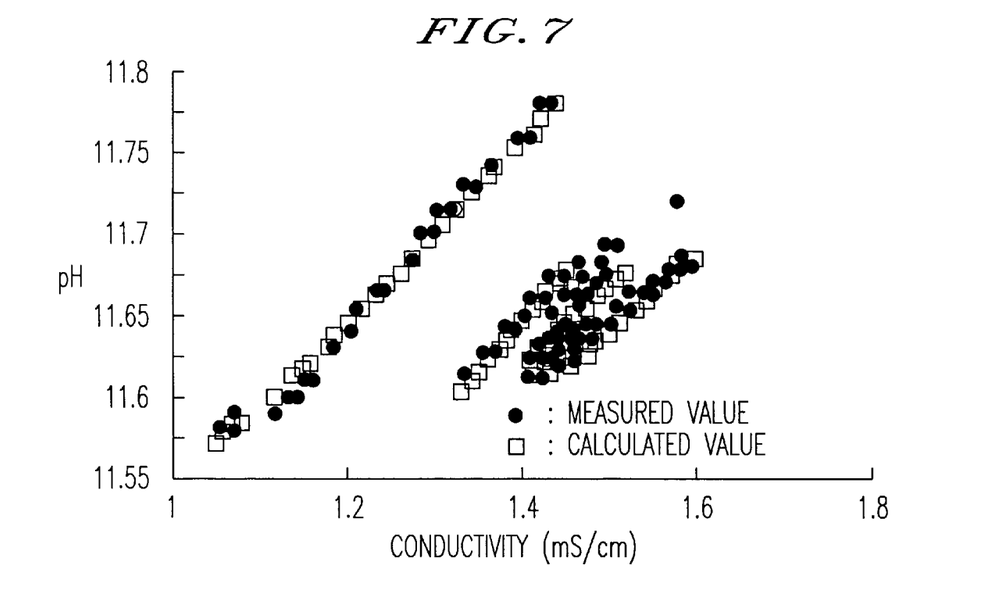

FIG. 7 shows graphs of data plotted with respect to the conductivity and pH values of the developing fluid which have been measured at each developing process. The following equation (5) is assumed and the constants A, B and C thereof are derived from the graphs. pH values are calculated by applying the constants A, B, and C to the measured data as to the conductivity and the absorbance. The pH values are plotted and overlapped with the measured data. Absorbance measuring wavelengths have been 450 nm, 630 nm and 760 nm for the red, green and blue phororesist films.

$$\text{pH value} \approx A \cdot \log(\rho) + \sum_{i=1}^{n} B_i \cdot A_{bi} + C \qquad (5)$$

where ρ; the conductivity of the developing fluid, $A_{bi}$; the absorbance at the wavelength determined for each phororesist film, $B_i$; constants for $A_{bi}$, A; constants, and n; a natural number equal to or less than the number of kinds of the photoresist films used. It is evident from FIG. 7 that the calculated values are fairly consistent with the measured data. The developing fluid density has been adjusted to keep the pH value constant. As a consequence, the developed color photoresist films have been obtained with constant pattern sizes. In this way, thus, different photoresist films may be processed in the same developing fluid.

Embodiment 3

This embodiment is also directed to a plurality of kinds of photoresist films patterned on substrates. Prepared have been sample glass substrates on which red, green and blue photoresist films of acrylic system negative materials (Product Nos. CR-2000, CG-2000 and CB-2000 manufactured by Fuji Hunt Electronics Technology, Inc.) have been coated in thicknesses of 2 μm, respectively. The photoresist films each have been subject to exposure and, then, development in a circulated developing fluid consisting of a water solution of TMAH.

The developing fluid has been initially adjusted to be 0.06 wt % in density. 74 sheets of the substrates have been developed in the fluid. After that but before the 75th sheet of the substrate is developed, the TMAH has been added to make the fluid approximately initial in conductivity and the next developing process has commenced.

Figure 8:
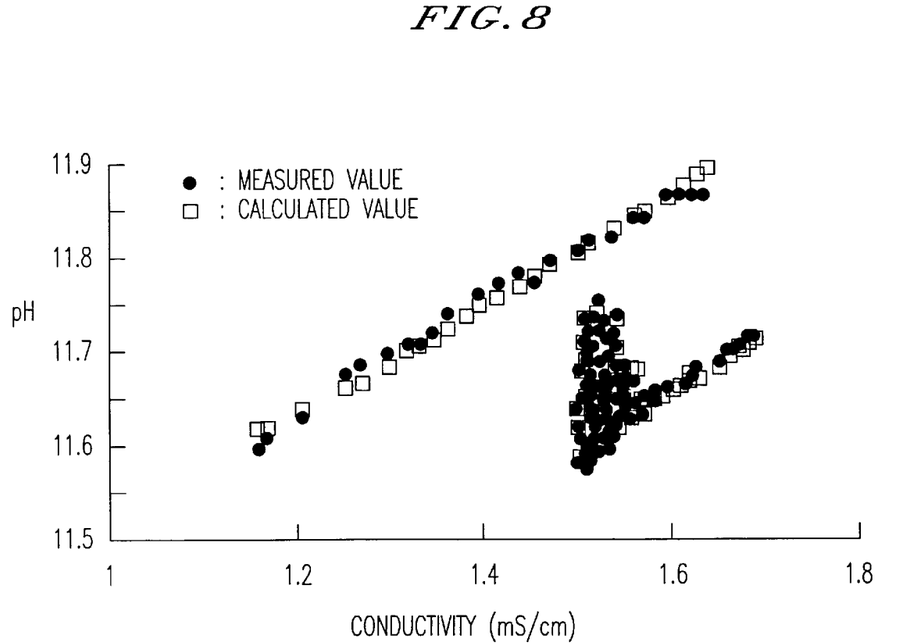

FIG. 8 shows graphs of data plotted with respect to the conductivity and pH values of the developing fluid which have been measured at each developing process. The following equation (6) is assumed and the constants A, B and C thereof are derived from the graphs. pH values are calculated by applying the constants A, B, and C to the measured data as to the conductivity and the absorbance. The pH values are plotted and overlapped with the measured data. Absorbance measuring wavelengths have been 450 nm, 630 nm and 760 nm for the red, green and blue phororesist films.

$$\text{pH value} \approx A \cdot \log(\rho) + B \cdot Ab + C \qquad (6)$$

The absorbance value used in this case has been the one at the wavelength of 400 nm which is visible light close to the ultraviolet ray. The absorbance values for the red, green and blue photoresist films at the wavelength of 400 nm are approximately 0.85, 0.80 and 0.95, respectively.

It is apparent from FIG. 8 that the calculated pH values are of fairly good consistency with the measured ones. The developing fluid density has been so adjusted that the pH value calculated by the conductivity and absorbance data may be kept constant. As a result, the developed color photoresist films have been obtained with constant pattern sizes.

Figure 9:
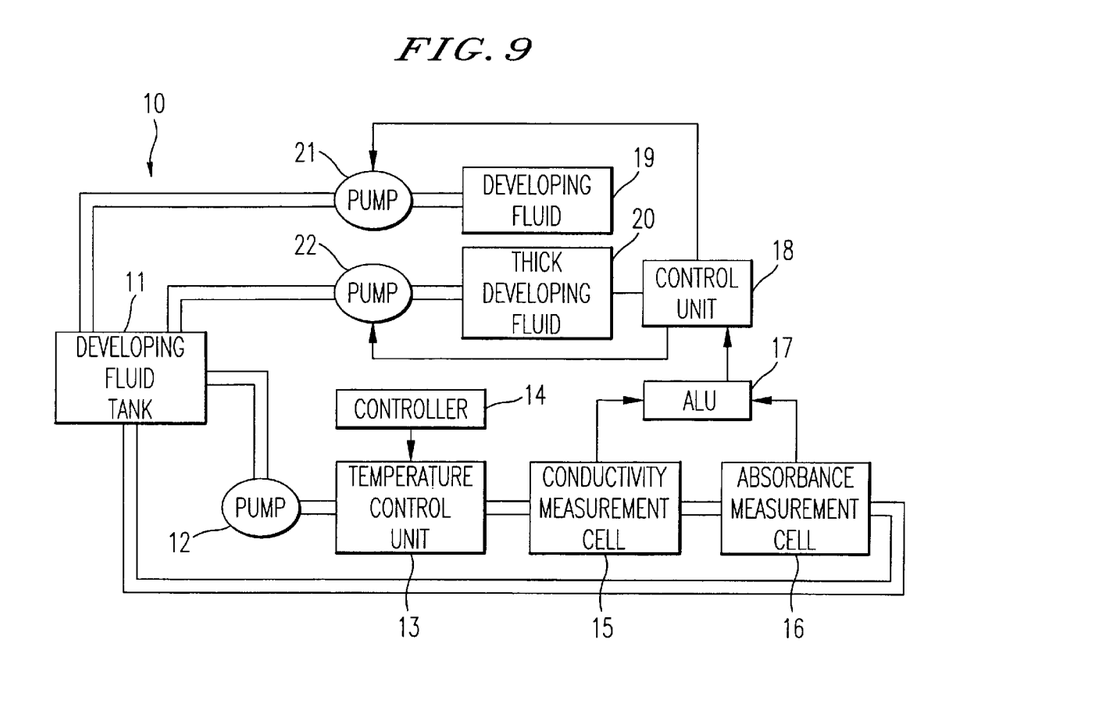
FIG. 9 is a block diagram of an apparatus for developing photoresist films formed on substrates in accordance with the present invention.

FIG. 9 is a block diagram of a developing apparatus to perform the methods of developing photoresist films explained above. The developing apparatus 10 includes a developing fluid tank 11, a pump 12, a temperature control unit 13, a conductivity measurement cell 15, and an absorbance measurement cell 16. The photoresist films are developed in the developing fluid tank 11 at the patterning process. A developing fluid is circulated through the pump 12, the control unit 13, and the measurement cells 15 and 16.

The developing apparatus 10 further includes a temperature controller 14, an arithmetic and logic operation unit (ALU) 17, a control unit 18, a developing fluid container 19, a thick developing fluid container 20, and pumps 21 and 22, respectively, connected to the containers 19 and 20. Conventional temperature control components, e.g., an electric heater and a thermostat controller may be used for the temperature control unit 13 and the temperature controller 14. The measurement cells 15 and 16 may also be conventional instruments available on the market, e.g., the conductivity measurement cell of model DS-15 manufactured by Horiba Seisakusho, Tokyo, Japan and the absorbance measurement cell manufactured by Shimazu Seisakusho, Kyoto, Japan.

The pump 12 circulates the developing fluid. The temperature control unit 13 keeps the temperature of the developing fluid in a predetermined range in response to an instruction of the temperature controller 14. The cells 15 and 16 measure the conductivity and absorbance of the developing fluid, respectively. The ALU 17 calculates the data measured by the cells 15 and 16 in accordance with the equation (4), (5) or (6) to obtain a pH value and provides the calculated data to the control unit 18.

In order to keep the pH value of the developing fluid constant or in a predetermined range in accordance with the calculated data, the control unit 18 stores data of pH control value ranges and an absorbance upper limit value set by an operator and provides the pumps 21 and 22 with driving operation instructions. The pH value is controlled by the conductivity and/or the absorbance of the developing fluid. That is, the absorbance is adjusted by supplying the developing fluid from the container 19 to the tank 11 through the pump 21. The developing fluid in the container 19 is 0.06 wt% of TMHA in water solution. When the developing fluid is added to the tank 11 through pump 21, the absorbance can be lowered. As described above with reference to FIG. 3, the absorbance value increases in accordance with the quantity increase of photoresist in the developing fluid of the tank 11 resulting from repeated photoresist development processes. Where pH values are equal to or less than the control value range, the thick developing fluid is added from the container 20 to the tank 11 through the pump 22 in response to the instruction from the control unit 18. The thick developing fluid in the container 20 is 2.5 wt% of TMHA in water solution, for instance. When the pH values are more than the pH control value, no thick developing fluid is added and the operation returns to the measurement step. Thus, the pH value of the developing fluid is adjusted to be in the range.

Figure 10:
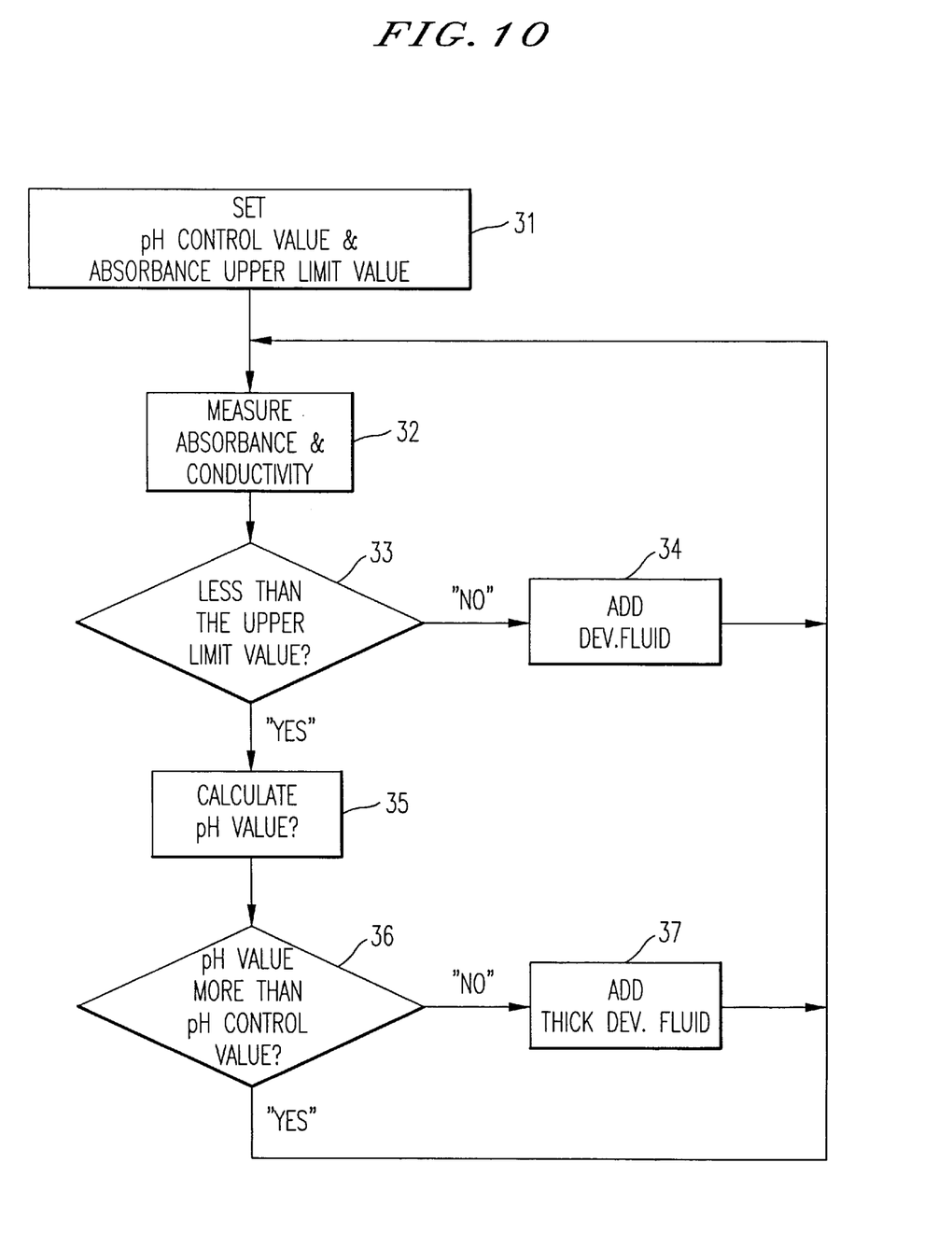
FIG. 10 is an operation flow chart of a method of developing a photoresist pattern of the invention.

FIG. 10 shows a flow chart of the operations to be carried out by the conductivity and absorbance measurement cells 15 and 16, the ALU 17 and the control unit 18. The pH control value and the absorbance upper limit value are set in the control unit 18 at step 31 by the operator. The conductivity and absorbance measurement cells 15 and 16 measure the developing fluid supplied from the tank 11 through the pump 12 and the temperature control unit 13 at step 32. The measured data are provided to the control unit 18 through the ALU 17. The control unit 18 checks at step 33 whether the measured absorbance value exceeds the upper limit or not. Where the former is equal to or more than the latter, the control unit 18 instructs the pump 21 to add the ordinary developing fluid (0.06 wt% of TMHA in water solution) from the container 19 to the tank 11 at the step 34. The control unit 18 is continuously provided through the ALU 17 with absorbance data measured by the cell 16 and check them repeatedly. In the case that the measured absorbance value is less than the upper limit value, the ALU 17 calculates pH values based on the measured absorbance and conductivity data at step 35. The control unit 18 also checks at step 36 if the calculated pH value is more than the pH control value. Where the former is equal to or less than the latter, the control unit 18 enables the pump 22 to supply the thick developing fluid (2.5 wt% of TMHA in water solution) from the container 20 to the tank 11 at step 37. Steps 32 through 36 are then repeated. When the calculated pH value is more than the pH control value, the operation directly returns to measurement step 32. Thus, the pH value of the developing fluid in the tank 11 is kept in the predetermined range.

According to the invention, as set forth above, the pH value or its equivalence in the developing fluid can be calculated by using the measured conductivity and absorbance thereof so that the former can be controlled by monitoring the latter. Even though the density of the photoresist material dissolved in the fluid varies, the pH value can be adjusted in accordance with the conductivity. As a result, it prevents the photoresist pattern size from changing due to the developing fluid density variations. Thus, the fluid utilization efficiency can be improved with the developing accuracy secured.

What we claim is:

1. A method of developing photoresist films formed on a plurality of substrates, comprising the steps of:

circulating a developing fluid to substantially develop said photoresist films;

measuring the conductivity and the absorbance of said developing fluid;

adding a first developing fluid to said circulating developing fluid in response to absorbance measured by said measuring step to adjust the concentration of said circulating developing fluid;

calculating the pH value or its equivalence of said developing fluid in accordance with said conductivity and absorbance measuring step; and adding a second developing fluid to said circulating fluid in response to said pH value or its equivalence calculated by said calculating step to maintain said pH value or said equivalence to be in a predetermined range, said second developing fluid being of thicker concentration of photoresist materials than said first developing fluid.

2. The method of developing photoresist films according to claim 1, wherein said calculating step obtains variation in the conductivity relative to variation in the absorbance of the developing fluid at a fixed pH value, and treats the variation in the conductivity as a correction factor to calculate the pH value in said developing fluid.

3. The method of developing photoresist films formed on substrates according to claim 2, wherein invisible light with a wavelength of a infrared or ultraviolet region or visible light with a wavelength close to an infrared or ultraviolet region is applied to measure said absorbance in said measuring step.

4. The method of developing photoresist films formed on substrates according to claim 2, wherein said photoresist films are composed of color photoresist materials thereby to make a color filter.

5. The method of developing photoresist films formed on substrates according to claim 2, wherein said maintaining step carries out adding a fresh developing fluid and/or a thick developing fluid to said developing fluid in said circulating step.

6. The method of developing photoresist films formed on substrates according to claim 1, wherein invisible light with a wavelength of a infrared or ultraviolet region or visible light with a wavelength close to an infrared or ultraviolet region is applied to measure said absorbance in said measuring step.

7. The method of developing photoresist films formed on substrates according to claim 1, wherein said photoresist films are composed of color photoresist materials thereby to make a color filter.

8. The method of developing photoresist films formed on substrates according to claim 1, wherein said maintaining step carries out adding a fresh developing fluid and/or a thick developing fluid to said developing fluid in said circulating step.

9. A method of developing photoresist films formed on a plurality of substrates, comprising the steps of:

circulating a developing fluid to sequentially develop said photoresist films;

measuring the conductivity and the absorbance of said developing fluid;

calculating the pH value or its equivalence of said developing fluid by applying the following equation to said conductivity and said absorbance measured in said measuring step $$A \cdot \log(\rho) + B \cdot A_b$$

where $\rho$ and $A_b$ denote said measured conductivity and absorbance, respectively, and A and B are constants; and maintaining said pH value or said equivalence to be in a predetermined range.

10. The method of developing photoresist films formed on substrates according to claim 9, wherein invisible light with a wavelength of a infrared or ultraviolet region or visible light with a wavelength close to an infrared or ultraviolet region is applied to measure said absorbance in said measuring step.

11. The method of developing photoresist films formed on substrates according to claim 9, wherein said photoresist films are composed of color photoresist materials thereby to make a color filter.

12. The method of developing photoresist films formed on substrates according to claim 9, wherein said maintaining step carries out adding a fresh developing fluid and/or a thick developing fluid to said developing fluid in said circulating step.

13. A method of developing a plurality of kinds of photoresist films sequentially formed on substrates, comprising the steps of:

circulating an alkaline developing fluid to sequentially develop said photoresist films;

measuring the conductivity and the absorbance of said developing fluid;

calculating the pH value or its equivalence of said developing fluid by applying the following equation to said conductivity and said absorbance measured in said measuring step $$A \cdot \log(\rho) + \sum_{i=1}^{n} (B_i \cdot A_{bi} + C_i)$$

where $\rho$ is said measured conductivity, $A_{bi}$ is said absorbance, $B_i$ is a constant corresponding to $A_{bi}$, A is a constant, $C_i$ is a constant corresponding to a kind of said photoresist used and n is a natural number equal to or less than the number of said kinds of said photoresist films; and maintaining said pH value or said equivalence to be in a predetermined range.

14. The method of developing photoresist films formed on substrates according to claim 13, wherein invisible light with a wavelength of a infrared or ultraviolet region or visible light with a wavelength close to an infrared or ultraviolet region is applied to measure said absorbance in said measuring step.

15. The method of developing photoresist films formed on substrates according to claim 13, wherein said photoresist films are composed of color photoresist materials thereby to make a color filter.

16. The method of developing photoresist films formed on substrates according to claim 15, wherein said photoresist films are formed from at least two kinds of color ones selected from red, green and blue films, said measuring step uses an infrared or ultraviolet region wavelength of light for measuring the absorbance or a visible region wavelength thereof close to the infrared or ultraviolet region.

17. The method of developing photoresist films formed on substrates according to claim 13, wherein said maintaining step carries out adding a fresh developing fluid and/or a thick developing fluid to said developing fluid in said circulating step.

18. A method of developing a plurality kinds of photoresist films formed on substrates, comprising the steps of:

circulating an alkaline developing fluid to sequentially develop said photoresist films;

measuring the conductivity and the absorbance of said developing fluid;

calculating the pH value or its equivalence of said developing fluid by applying the following equation to said conductivity and said absorbance measured in said measuring step $$A \cdot \log(\rho) + B \cdot A_b$$

where $\rho$ is said measured conductivity, $A_b$ is said absorbance at a wavelength of light at which changes with said absorbance due to photoresist materials desolved in said developing fluid are substantially the same as for each of said plurality kinds of photoresist films, and A and B are constants; and maintaining said pH value or said equivalence to be in a predetermined range.

19. The method of developing photoresist films formed on substrates according to claim 18, wherein invisible light with a wavelength of a infrared or ultraviolet region or visible light with a wavelength close to an infrared or ultraviolet region is applied to measure said absorbance in said measuring step.

20. The method of developing photoresist films formed on substrates according to claim 18, wherein said photoresist films are composed of color photoresist materials thereby to make a color filter.

21. The method of developing photoresist films formed on substrates according to claim 20, wherein said photoresist films are formed from at least two kinds of color ones selected from red, green and blue films, said measuring step uses an infrared or ultraviolet region wavelength of light for measuring the absorbance or a visible region wavelength thereof close to the infrared or ultraviolet region.

22. The method of developing photoresist films formed on substrates according to claim 18, wherein said maintaining step carries out adding a fresh developing fluid and/or a thick developing fluid to said developing fluid in said circulating step.

23. An apparatus developing photoresist films formed on a plurality of substrates, comprising;
   a pump to circulate a developing fluid to develop said photoresist films;
   a first cell to measure the conductivity of said fluid;
   a second cell to measure the absorbance of said fluid;
   an arithmetic and logic operation unit to calculate the pH value in accordance with said conductivity and absorbance measured by said first and second cells, respectively; and
   a control unit to maintain said pH value to be in a predetermined range.

24. A method of making a color filter, comprising the steps of:
   forming photoresist films on substrates;
   exposing said photoresist films through a predetermined pattern;
   developing said photoresist films exposed in exposing step by an alkaline developing fluid;
   circulating said developing fluid to sequentially develop said photoresist films;
   measuring the conductivity and the absorbance of said developing fluid;
   calculating the pH value or its equivalence of said developing fluid in accordance with the following equation;

$$A \cdot \log(\rho) + B \cdot A_b + C$$

where $\rho$ and $A_b$ denote said measured conductivity and absorbance, respectively, and A, B and C are constants; and
   maintaining said pH value or said equivalence to be in the range from 11.0 through 12.0.

25. A method of making a color filter, comprising the steps of:
   forming a plurality of kinds of color photoresist films on substrates;
   exposing said photoresist films through a predetermined pattern;
   developing said photoresist films exposed in exposing step by an alkaline developing fluid;
   circulating said developing fluid to sequentially develop said photoresist films;
   measuring the conductivity and the absorbance of said developing fluid;
   calculating the pH value or its equivalence of said developing fluid in accordance with the following equation;

$$A \cdot \log(\rho) + \sum_{i=1}^{n} (B_i \cdot A_{bi} + C_i)$$

where $\rho$ is said measured conductivity, $A_{bi}$ is said absorbance, $B_i$ is a constant corresponding to $A_{bi}$, A is a constant, $C_i$ is a constant corresponding to a kind of said photoresist used and n is a natural number equal to or less than the number of said kinds of said photoresist films; and
   maintaining said pH value or said equivalence to be in the range from 11.0 through 12.0.

26. A method of developing color photoresist films, comprising the steps of:
   forming said photoresist films on substrates;
   exposing said photoresist films through a predetermined pattern;
   developing said photoresist films exposed in exposing step by an alkaline developing fluid;
   circulating said developing fluid to sequentially develop said photoresist films;
   measuring the conductivity and the absorbance of said developing fluid;
   calculating the pH value or its equivalence of said developing fluid in accordance with the following equation;

$$A \cdot \log(\rho) + B \cdot A_b$$

where $\rho$ and $A_b$ denote said measured conductivity and. absorbance, respectively, and A and B are constants; and
   maintaining said pH value or said equivalence to be in the range from 11.0 through 12.0.

27. A liquid crystal display device having a first substrate, a color filter formed on said first substrate, a second substrate provided opposite to said first substrate, and a liquid crystal layer held between said first and second substrates, said color filter including photoresist films formed on one of said first and second substrates, said photoresist films being developed by the steps of:
   circulating a developing fluid to sequentially develop said photoresist films;
   measuring the conductivity and the absorbance of said developing fluid;
   calculating the pH value or its equivalence of said developing fluid in accordance with said conductivity and absorbance measured in said measuring step; and
   maintaining said pH value or said equivalence to be in a predetermined range.

* * * * *